United States Patent
Lee et al.

(10) Patent No.: US 7,839,187 B2
(45) Date of Patent: Nov. 23, 2010

(54) COUNTER AND FREQUENCY DIVIDER THEREOF

(75) Inventors: Chow-Peng Lee, Sinshih Township, Tainan County (TW); Aung Aung Yinn, Sinshih Township, Tainan County (TW)

(73) Assignee: Himax Analogic, Inc., Sinshih Township, Tainan County (TW)

( * ) Notice: Subject to any disclaimer, the term of this patent is extended or adjusted under 35 U.S.C. 154(b) by 4 days.

(21) Appl. No.: 12/418,714

(22) Filed: Apr. 6, 2009

(65) Prior Publication Data

US 2010/0254506 A1 Oct. 7, 2010

(51) Int. Cl.
*H03B 19/06* (2006.01)

(52) U.S. Cl. .................. 327/118; 327/115; 327/117; 327/203; 377/48

(58) Field of Classification Search .................. 327/115, 327/116, 117, 118, 355–360, 202, 203, 208–212, 327/218; 377/47, 48
See application file for complete search history.

(56) References Cited

U.S. PATENT DOCUMENTS

| | | | | |
|---|---|---|---|---|
| 5,130,568 A | * | 7/1992 | Miller et al. | 327/202 |
| 6,392,462 B2 | * | 5/2002 | Ebuchi et al. | 327/295 |
| 2009/0296878 A1 | * | 12/2009 | Tsai | 377/47 |
| 2010/0046693 A1 | * | 2/2010 | Ellersick | 377/47 |

* cited by examiner

*Primary Examiner*—Lincoln Donovan
*Assistant Examiner*—Brandon S Cole
(74) *Attorney, Agent, or Firm*—Thomas, Kayden, Horstemeyer & Risley, LLP

(57) ABSTRACT

A frequency divider includes a transmission gate, a first inverter, a first switch circuit, a second switch circuit, and a second inverter. The transmission gate transmits a clock signal according to an inverted enable signal. The first inverter inverts the clock signal outputted from the transmission gate. The first switch circuit generates a first control signal according to the inverted clock signal and an output signal of the frequency divider. The second switch circuit generates a second control signal according to the clock signal, the inverted clock signal, and the first control signal. The second inverter inverts the second control signal to generate the output signal. The frequency of the clock signal is a multiple of the frequency of the output signal.

12 Claims, 3 Drawing Sheets

COUNTER AND FREQUENCY DIVIDER THEREOF

BACKGROUND

1. Field of Invention

The present invention relates to a counter. More particularly, the present invention relates to a counter composed of at least one frequency divider.

2. Description of Related Art

Many computer systems, such as the power supply circuit of the white light emitting diode circuit and the power management circuit, use a counter for implementing their intended function. The power consumption of computer systems is important to system designers because it directly affects the working time of the computer system. Furthermore, because energy storage subsystems (e.g., batteries) are often bulky and heavy, power consumption indirectly affects the overall size and weight of the computer system.

In computer systems having counter circuits implementing a watchdog reset or a power management transition timer, the corresponding event is triggered if the corresponding counter reaches a predetermined value. For example, in a disk circuit, a counter circuit is reset by the periodic disk access. If there is no disk accesses over a given time interval, the counter is run down (or up) to a predetermined value thereby triggering a transition to another power management mode, e.g., standby mode.

Unfortunately, because the associated power dissipation and the area of the counter circuit are large, which limits the number of counters in the computer system, and some functions of the computer system can not be implemented as a result.

Therefore, there is a need for a new counter which can reduce the power consumption and the required circuit area.

SUMMARY

According to one embodiment of the present invention, a frequency divider is disclosed. The frequency divider includes a transmission gate, a first inverter, a first switch circuit, a second switch circuit, and a second inverter. The transmission gate transmits a clock signal according to an enable signal. The first inverter inverts the clock signal outputted from the transmission gate. The first switch circuit generates a first control signal according to the inverted clock signal and an output signal of the frequency divider. The second switch circuit generates a second control signal according to the clock signal, the inverted clock signal, and the first control signal. The second inverter inverts the second control signal to generate the output signal. The frequency of the clock signal is a multiple of the frequency of the output signal.

According to another embodiment of the present invention, a counter is disclosed. The counter includes a plurality of frequency dividers connected in series; each of the frequency dividers includes a transmission gate, a first inverter, a first switch circuit, a second switch circuit, and a second inverter. The transmission gate transmits a clock signal according to an enable signal. The first inverter inverts the clock signal outputted from the transmission gate. The first switch circuit generates a first control signal according to the inverted clock signal and an output signal of the frequency divider. The second switch circuit generates a second control signal according to the clock signal, the inverted clock signal, and the first control signal. The second inverter inverts the second control signal to generate the output signal, in which the frequency of the clock signal is a multiple of the frequency of the output signal.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
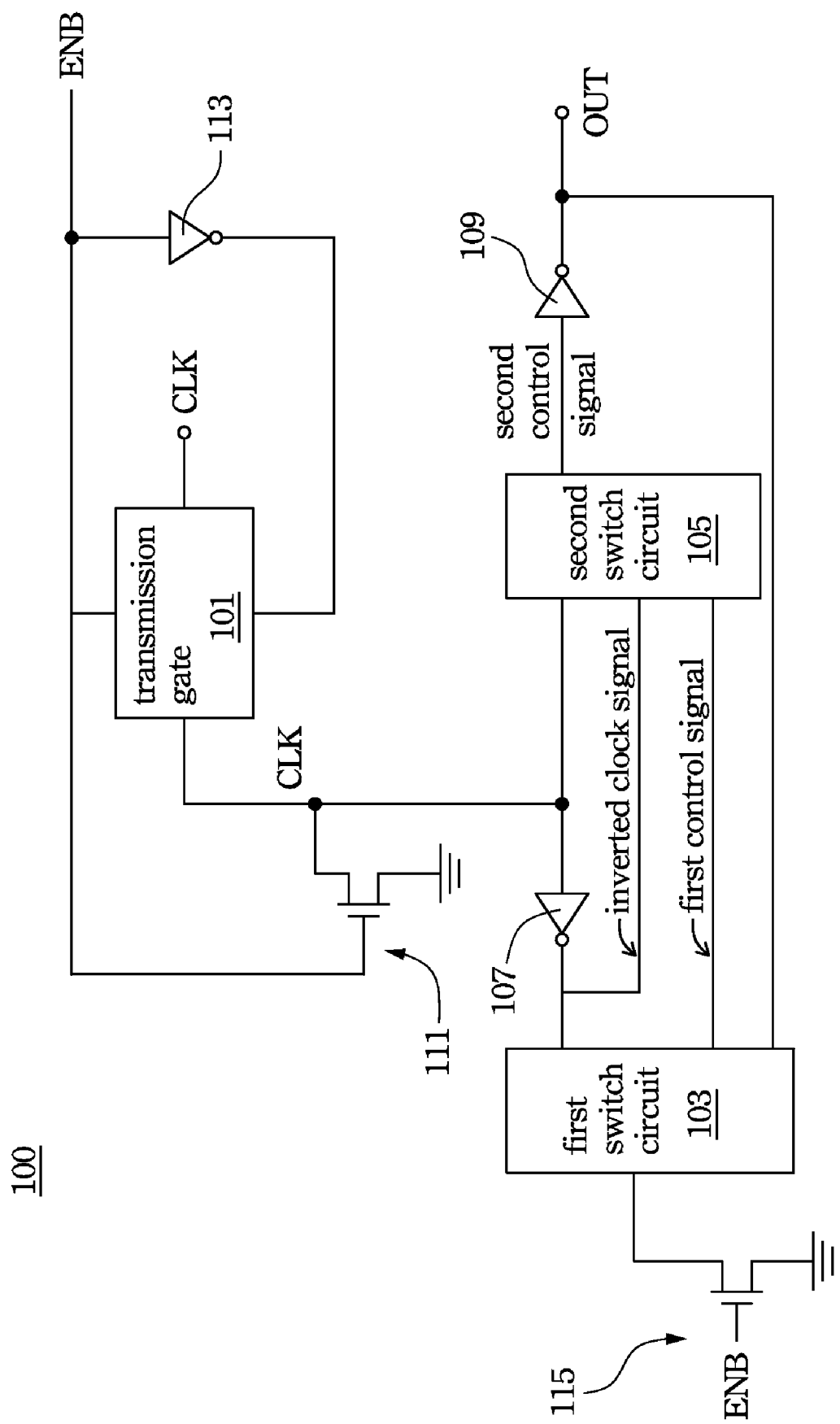
FIG. 1 shows a circuit diagram of the frequency divider according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The following embodiments use switches to implement the frequency divider and the counter, which reduces the number of the logic gates, and the area and the power consumption of the frequency divider and the counter are reduced as a result.

FIG. 1 shows a circuit diagram of the frequency divider according to one embodiment of the present invention. The frequency divider 100 includes a transmission gate 101, the first inverter 107, a first switch circuit 103, a second switch circuit 105, and the second inverter 109. The transmission gate 101 transmits a clock signal CLK according to the inverted enable signal ENB, and the first inverter 107 inverts the clock signal CLK outputted from the transmission gate 101. The first switch circuit 103 generates a first control signal according to the inverted clock signal and an output signal OUT of the frequency divider 100. The second switch circuit 105 generates a second control signal according to the clock signal CLK, the inverted clock signal, and the first control signal, and the second inverter 109 inverts the second control signal to generate the output signal OUT.

In this frequency divider 100, the second control signal changes its state once only if the clock signal CLK has changed its state twice, so that the frequency of the clock signal CLK is a multiple of the frequency of the output signal OUT. For example, if the frequency of the clock signal CLK is 200 MHZ, then the frequency of the output signal OUT might be 200 MHZ/2, which is equal to 100 MHZ.

The frequency divider 100 further includes a ninth transistor 111 and a tenth transistor 115, in which the ninth transistor 111 is connected to the output terminal of the transmission gate 101, and the tenth transistor 115 is connected to the first switch circuit 103. The ninth transistor 111 and the tenth transistor 115 discharge the output terminals of the transmission gate 101 and the first switch circuit 103 to a logic low level according to the inverted enable signal ENB. In detail, the inverted enable signal ENB controls the ninth transistor 111 and the tenth transistor 115 to discharge the output terminals to logic 0 in the initial stage.

Figure 2:
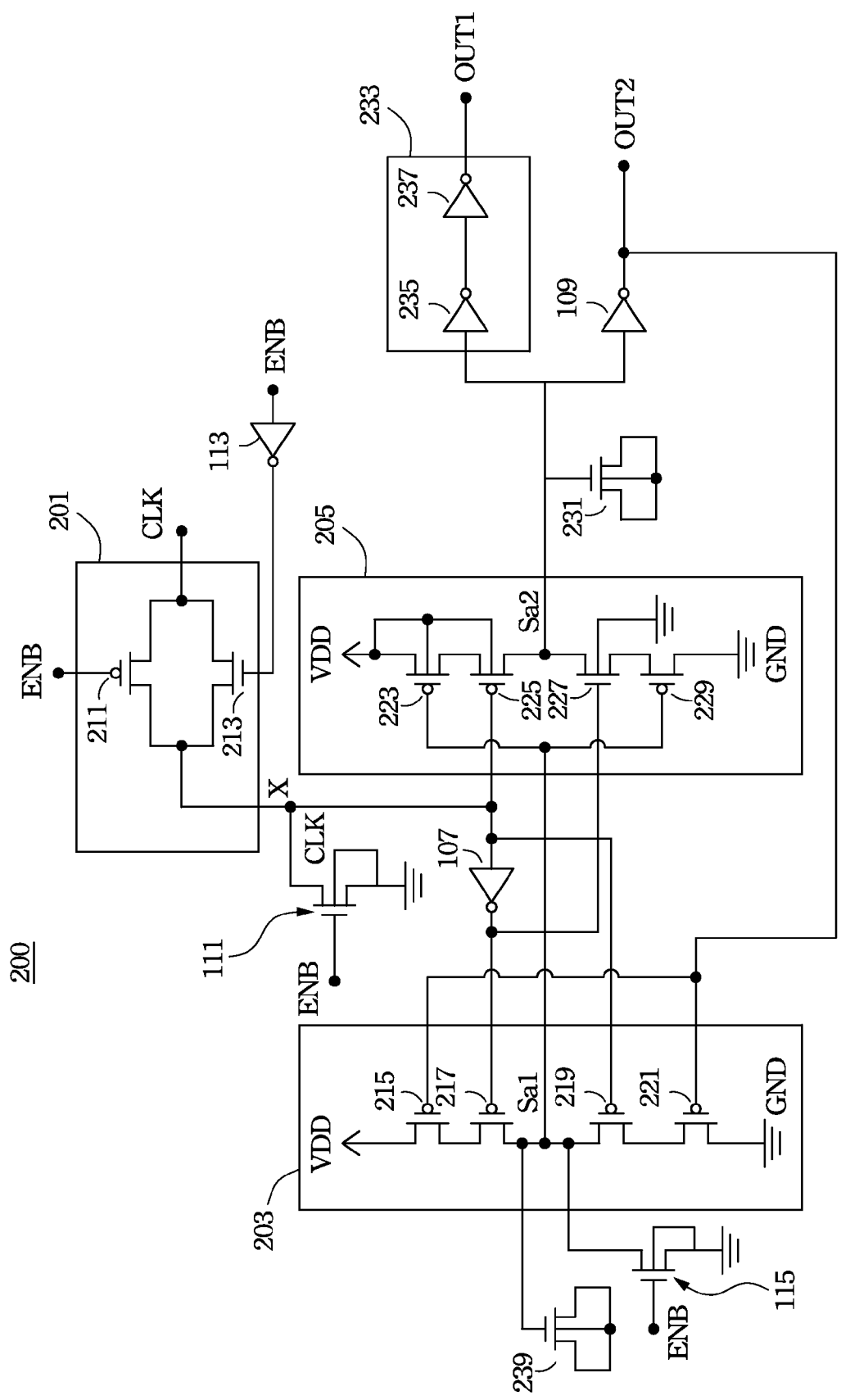
FIG. 2 shows a circuit diagram of the frequency divider according to another embodiment of the present invention.

FIG. 2 shows a circuit diagram of the frequency divider according to another embodiment of the present invention. The frequency divider 200 includes a transmission gate 201, the first inverter 107, the first switch circuit 203, the second switch circuit 205, and the second inverter 109.

The transmission gate 201, including a PMOS transistor 211 and a NMOS transistor 213 connected parallely, transmits a clock signal CLK according to the inverted enable signal ENB, in which the NMOS transistor 213 receives the inverted enable signal ENB through the inverter 113. For example, if the inverted enable signal ENB is logic 0, the transmission gate 201 passes the clock signal CLK, else the transmission gate 201 blocks the clock signal CLK.

The first switch circuit 203 generates a first control signal Sa1 according to the inverted clock signal and an output signal OUT2 of the frequency divider 200. The first switch circuit 203 includes a fifth transistor 215, a sixth transistor 217, a seventh transistor 219, and an eighth transistor 221, which are all P channel field effect transistors (PMOS). The fifth transistor 215 has a gate, a source, and a drain, in which the source of the fifth transistor 215 receives the supply voltage VDD. The eighth transistor 221 has a gate, a source, and a drain, in which the drain of the eighth transistor 221 is connected to the ground terminal GND, and the gates of the fifth transistor 215 and the eighth transistor 221 receive the output signal OUT2 of the frequency divider 200.

The sixth transistor 217 of the first switch circuit 203 has a gate, a source, and a drain, in which the gate of the sixth transistor 217 receives the inverted clock signal, and the source of the sixth transistor 217 is connected to the drain of the fifth transistor 215. The seventh transistor 219 has a gate, a source, and a drain. The gate of the seventh transistor 219 receives the clock signal CLK, the source of seventh transistor 219, outputting the first control signal Sa1, is connected to the drain of the sixth transistor 217, and the drain of the seventh transistor 219 is connected to the source of the eighth transistor 221.

The second switch circuit 205 generates a second control signal Sa2 according to the clock signal CLK, the inverted clock signal, and the first control signal Sa1, and the second inverter 109 inverts the second control signal Sa2 to generate the output signal OUT2. The second switch circuit 205 includes a first transistor 223, a second transistor 225, a third transistor 227, and a fourth transistor 229. The first transistor 223 has a gate, a source receiving the supply voltage VDD, and a drain. The fourth transistor 229 has a gate, a source, and a drain, in which the drain of the fourth transistor 229 is connected to a ground terminal GND, and the gates of the first transistor 223 and the fourth transistor 229 receive the first control signal Sa1 from the first switch circuit 203.

The second transistor 225 of the second switch circuit 205 has a gate, a source, and a drain, in which the gate of the second transistor 225 receives the clock signal CLK, and the source of the second transistor 225 is connected to the drain of the first transistor 223. The third transistor 227 has a gate, a source, and a drain. The gate of the third transistor 227 receives the inverted clock signal, the drain of third transistor 227, connected to the drain of the second transistor 225, outputs the second control signal Sa2, and the source of the third transistor 227 is connected to the source of the fourth transistor 229. Among those transistors, the first transistor 223, the second transistor 225, and the fourth transistor 229 are P channel field effect transistors (PMOS), and the third transistor 227 is N channel field effect transistors (NMOS).

The frequency divider 200 further includes a ninth transistor 111 connected to the a output terminal x of the transmission gate 201, and a tenth transistor 115 connected to the first switch circuit 203, in which the ninth transistor 111 and the tenth transistor 115 discharge the output terminal x and the first control signal Sa1 to the logic low level according to the inverted enable signal ENB in the initial stage where the inverted enable signal ENB is at logic high level. Therefore, the second transistor 225 and the first transistor 223 are turned on by the clock signal and the first control signal Sa1 respectively, and the third transistor 227 is turned off by the inverted clock signal, which makes the second control signal Sa2 and output signal OUT2 stay at logic high level and logic low level respectively.

When the clock signal CLK changes to logic high level (the inverted clock signal is at logic low level) and the transmission gate 201 is enabled to pass the clock signal CLK, the fifth transistor 215 and the sixth transistor 217 are turned on, the seventh transistor 219 and the eighth transistor 221 are turned off, and the first control signal Sa1 is pulled from logic low level to logic high level as a result, in which case the second control signal Sa2 stays unchanged because the second transistor 225 and the third transistor 227 are turned off by the clock signal CLK and the inverted clock signal.

When the clock signal CLK changes to logic low level, the sixth transistor 217 is turned off by the inverted clock signal, and the seventh transistor 219 and the eighth transistor 221 are turned on by the clock signal and the output signal OUT2 respectively, which pulls the first control signal Sa1 to logic low level, and the second control signal Sa2 is also pulled to logic low level because the third transistor 227 and the fourth transistor 229 are turned on correspondingly.

In other words, the second control signal Sa2 only changes only once while the clock signal CLK has changed twice. Therefore, the frequency of the output signal OUT 1/OUT 2 is half of the frequency of the clock signal CLK.

The frequency divider 200 further includes a first capacitor 231, a second capacitor 239 and a buffer 233. The first capacitor 231, connected to the drain of the second transistor 225, maintains the voltage value of the second control signal Sa2. The second capacitor 239, connected to the drain of the sixth transistor 217, maintains the voltage value of the first control signal Sa1. The buffer OUT1 are added to drive the loads (not shown) more effectively.

Figure 3:
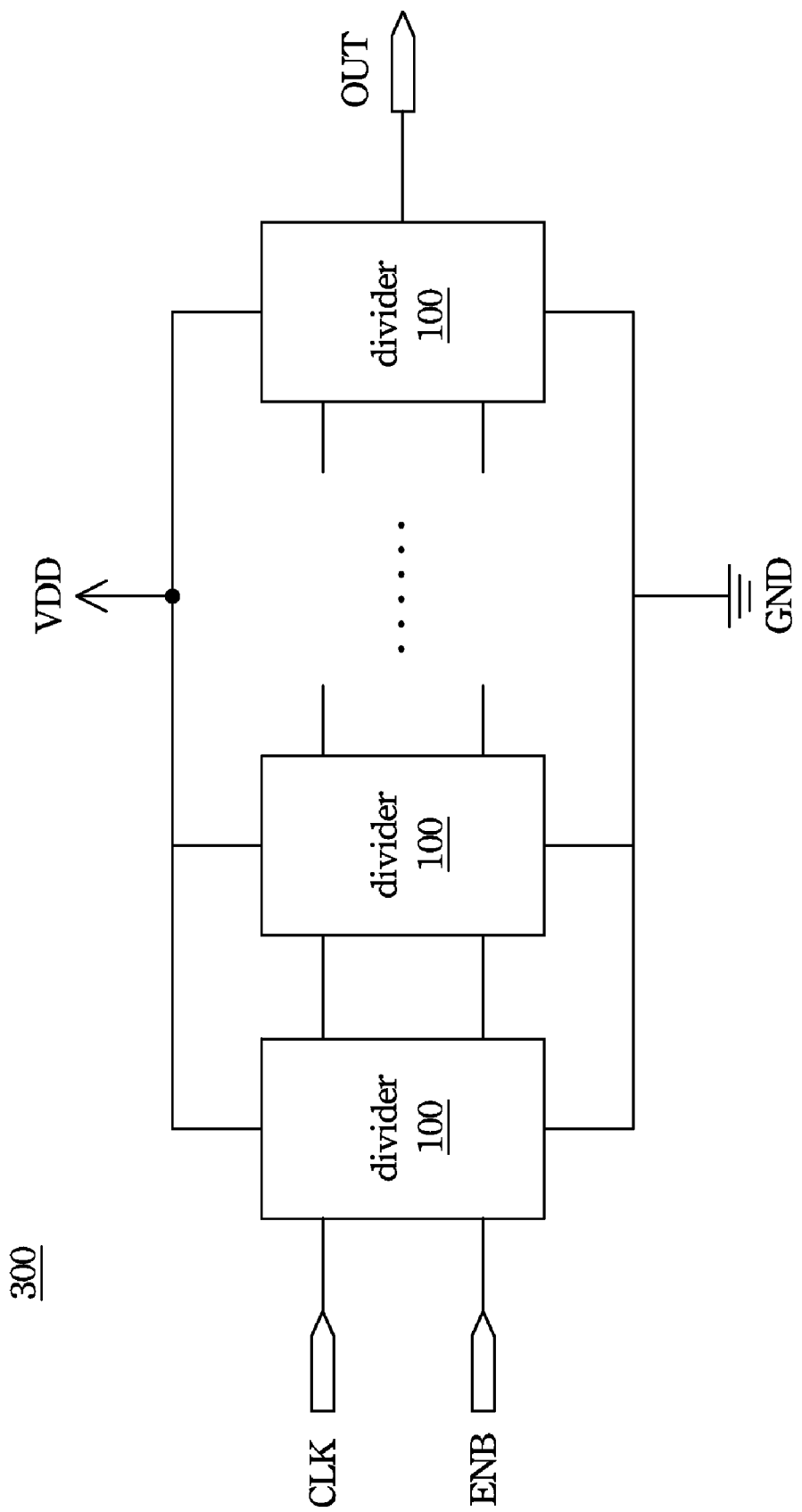
FIG. 3 shows a block diagram of the counter according to one embodiment of the present invention.

FIG. 3 shows a block diagram of the counter according to one embodiment of the present invention. The counter 300 includes several frequency dividers 100 connected in series, and the frequency of the output signal OUT is equal to the frequency of the clock signal CLK divided by $2^N$, in which N is the number of the frequency dividers 100. For example, if the counter 300 includes 3 frequency dividers, then the frequency of the output signal OUT is one eighth of the clock signal CLK. In more detail if the frequency of the clock signal CLK is 400 MHZ, then the frequency of the output signal OUT is 400 MHZ/8, equal to 50 MHZ. In this case, the delay time, defined as the period of the output signal OUT, is 20 ns.

The above embodiments use switches to implement the frequency divider and the counter, which reduces the number of the logic gates, and the area and the power consumption of the frequency divider and the counter are reduced as a result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency divider, comprising:
   a transmission gate transmitting a clock signal according to an inverted enable signal;
   a first inverter inverting the clock signal outputted from the transmission gate;
   a first switch circuit generating a first control signal according to the inverted clock signal and an output signal of the frequency divider;
   a second switch circuit generating a second control signal according to the clock signal, the inverted clock signal, and the first control signal, wherein the second switch circuit comprises:
   a first transistor having a gate, a source, and a drain, wherein the source of the first transistor receives a supply voltage;
   a fourth transistor having a gate, a source, and a drain, wherein drain of the fourth transistor is connected to a ground terminal, and the gates of the first transistor and the fourth transistor receive the first control signal from the first switch circuit;
   a second transistor having a gate, a source, and a drain, wherein the gate of the second transistor receives the clock signal, and the source of the second transistor is connected to the drain of the first transistor; and
   a third transistor having a gate, a source, and a drain, wherein the gate of the third transistor receives the inverted clock signal, the drain of third transistor, connected to the drain of the second transistor, outputs the second control signal, and the source of the third transistor is connected to the source of the fourth transistor; and
   a second inverter inverting the second control signal to generate the output signal,
   wherein the frequency of the clock signal is a multiple of the frequency of the output signal.

2. The frequency divider as claimed in claim 1, wherein the first transistor, the second transistor, and the forth transistor are P channel field effect transistors.

3. The frequency divider as claimed in claim 2, wherein the third transistor is N channel field effect transistors.

4. The frequency divider as claimed in claim 1, wherein the first switch circuit comprises:
   a fifth transistor having a gate, a source, and a drain, wherein the source of the first transistor receives the supply voltage;
   an eighth transistor having a gate, a source, and a drain, wherein drain of the eighth transistor is connected to the ground terminal, and the gates of the fifth transistor and the eighth transistor receive the output signal of the frequency divider;
   a sixth transistor having a gate, a source, and a drain, wherein the gate of the sixth transistor receives the inverted clock signal, and the source of the sixth transistor is connected to the drain of the fifth transistor; and
   a seventh transistor having a gate, a source, and a drain, wherein the gate of the seventh transistor receives the clock signal, the source of seventh transistor, outputting the first control signal, is connected to the drain of the sixth transistor, and the drain of the seventh transistor is connected to the source of the eighth transistor.

5. The frequency divider as claimed in claim 4, wherein the fifth transistor, the sixth transistor, the seventh transistor, and the eighth transistor are the P channel field effect transistors.

6. The frequency divider as claimed in claim 1, further comprising a ninth transistor connected to the a output terminal of the transmission gate, wherein the ninth transistor discharges the output terminal to a logic low level according to the inverted enable signal.

7. The frequency divider as claimed in claim 1, further comprising a first capacitor, connected to the drain of the second transistor, for maintaining a voltage value of the second control signal.

8. The frequency divider as claimed in claim 1, further comprising a second capacitor, connected to the drain of the sixth transistor, for maintaining a voltage value of the first control signal.

9. A counter, comprising:
   a plurality of frequency dividers connected in series, each of the frequency dividers comprising:
      a transmission gate transmitting a clock signal according to an inverted enable signal;
      a first inverter inverting the clock signal outputted from the transmission gate;
      a first switch circuit generating a first control signal according to the inverted clock signal and an output signal of the frequency divider;
      a second switch circuit generating a second control signal according to the clock signal, the inverted clock signal, and the first control signal, wherein the second switch circuit comprises:
      a first transistor having a gate, a source, and a drain, wherein the source of the first transistor receives a supply voltage;
      a fourth transistor having a gate, a source, and a drain, wherein drain of the fourth transistor is connected to a ground terminal, and the gates of the first transistor and the fourth transistor receive the first control signal from the first switch circuit;
      a second transistor having a gate, a source, and a drain, wherein the gate of the second transistor receives the clock signal, and the source of the second transistor is connected to the drain of the first transistor; and
      a third transistor having a gate, a source, and a drain, wherein the gate of the third transistor receives the inverted clock signal, the drain of third transistor, connected to the drain of the second transistor, outputs the second control signal, and the source of the third transistor is connected to the source of the fourth transistor; and
      a second inverter inverting the second control signal to generate the output signal, whereby the frequency of the clock signal is a multiple of the frequency of the output signal.

10. The counter as claimed in claim 9, wherein the frequency of the output signal is equal to the frequency of the clock signal divided by $2^N$, in which N is the number of the frequency dividers.

11. The counter as claimed in claim 9, wherein the output signal of previous frequency divider is inputted as the clock signal of the next frequency divider.

12. The counter as claimed in claim 9, wherein the first switch circuit comprises:
   a fifth transistor having a gate, a source, and a drain, wherein the source of the fifth transistor receives the supply voltage;
   an eighth transistor having a gate, a source, and a drain, wherein drain of the eighth transistor is connected to the ground terminal, and the gates of the fifth transistor and the eighth transistor receive the output signal of the frequency divider;
   a sixth transistor having a gate, a source, and a drain, wherein the gate of the sixth transistor receives the inverted clock signal, and the source of the sixth transistor is connected to the drain of the fifth transistor; and a seventh transistor having a gate, a source, and a drain, wherein the gate of the seventh transistor receives the clock signal, the source of seventh transistor, outputting the first control signal, is connected to the source of the sixth transistor, and the drain of the seventh transistor is connected to the source of the eighth transistor.

\* \* \* \* \*